United States Patent
Babcock

(10) Patent No.: US 6,677,775 B2
(45) Date of Patent: Jan. 13, 2004

(54) CIRCUIT TESTING DEVICE USING A DRIVER TO PERFORM ELECTRONICS TESTING

(75) Inventor: Douglas W. Babcock, Manchester, NH (US)

(73) Assignee: Analog Devices, Inc., Norwood, MA (US)

( * ) Notice: Subject to any disclaimer, the term of this patent is extended or adjusted under 35 U.S.C. 154(b) by 150 days.

(21) Appl. No.: 09/757,746

(22) Filed: Jan. 10, 2001

(65) Prior Publication Data

US 2002/0105350 A1 Aug. 8, 2002

(51) Int. Cl.[7] .............................................. G01R 31/28
(52) U.S. Cl. ................................... 324/765; 324/158.1
(58) Field of Search ............................. 324/158.1, 73.1, 324/763, 765; 714/724, 733, 726; 327/351; 330/257; 702/60

(56) References Cited

U.S. PATENT DOCUMENTS

| 3,678,294 A | * | 7/1972 | Glathe | 327/351 |
| 4,223,275 A | * | 9/1980 | den Brinker | 330/257 |
| 4,876,654 A | * | 10/1989 | Herscher | 702/60 |
| 4,929,888 A | * | 5/1990 | Yoshida | 324/158.1 |
| 5,146,159 A | | 9/1992 | Lau et al. | |
| 5,200,696 A | * | 4/1993 | Menis et al. | 324/158.1 |
| 5,377,202 A | | 12/1994 | Bryson et al. | |
| 5,842,155 A | | 11/1998 | Bryson et al. | |
| 6,166,569 A | | 12/2000 | McQuilkin | |
| 6,377,065 B1 | * | 4/2002 | Le et al. | 324/765 |

FOREIGN PATENT DOCUMENTS

| WO | WO 99/52203 | 10/1999 |
| WO | WO 00/39928 | 7/2000 |

* cited by examiner

Primary Examiner—Vinh P. Nguyen
(74) Attorney, Agent, or Firm—Samuels, Gauthier & Stevens, LLP

(57) ABSTRACT

A circuit testing apparatus includes a controlling processor for controlling stimulus signals to be applied to a circuit under test and for processing and storing response signals generated by the circuit under test in response to the stimulus signals. The stimulus signals are generated by a driver portion of a receiver/driver circuit coupled to a pin on the circuit under test. The driver includes an output stage circuit coupled to the pin on the circuit under test. The output stage circuit includes a linear amplifier circuit which receives a control signal via the controlling processor and generates from the control signal a drive signal to be applied to the circuit under test. The linear amplifier allows the driver to produce a drive signal with a high level of voltage and timing accuracy and, in the case of digital square pulse signals, a high level of pulse symmetry.

37 Claims, 4 Drawing Sheets

CIRCUIT TESTING DEVICE USING A DRIVER TO PERFORM ELECTRONICS TESTING

BACKGROUND OF THE INVENTION

In the integrated circuit industry, it is common practice to test finished ICs before they are shipped to users. To ensure efficiency and low cost, the ICs are typically tested automatically by systems which are collectively referred to as automatic test equipment (ATE). A typical ATE system for testing a finished IC includes a control system such as a personal computer programmed to run tests and process and store test result data automatically. The system also includes various power sources used to power the IC under test and to generate any test signals required for the tests. These can typically include DC as well as AC sources. The system also includes a "test head" in which the IC is mounted for the test. The test head typically includes a device interface board (DIB) which provides the appropriate electronic interface between the IC under test and the rest of the test system. The DIB typically makes connections to the IC via the connection pins on the IC package. Test stimulus signals generated by the test system are applied to the appropriate IC inputs and resulting response signals from the IC outputs are coupled to the test system via the DIB connections to the IC pins.

In present technology, ICs operate at extremely high speed and with very small voltage and power variation tolerances. As a result, the signals used in an ATE system to stimulate an IC under test must also be generated with extreme accuracy and precision. Signal voltage levels must be held to very close tolerances, and signals must be generated to operate at extremely high speed with very close timing tolerances. In addition, the quality of time varying test signals must be very carefully controlled. For example, when testing a digital circuit, it is often desirable to generate a train of square pulses to be applied to the circuit. Because of the high-speed and low-voltage requirements of present digital circuits, the various attributes of the square pulses, such as rise and fall times, duty cycle, symmetry, overshoot, undershoot, etc., must be controlled very accurately.

To generate these various test signals from the power supply outputs, and to accurately process resulting output response signals from the circuit under test, an ATE system typically also includes additional circuitry between the controlling processor and the DIB. This circuitry, commonly referred to as "pin electronics," includes driving circuitry for generating the stimulus signals to be applied to the IC input pins and receiving and detection circuitry for processing response signals from the IC output pins.

Conventional pin driver circuits exhibit various drawbacks when they are called upon to generate the highly accurate stimulus signals required by present high-speed circuits. For example, conventional amplification stages which require current to switch on and off to generate square pulses cannot generate short pulses with symmetry, i.e., substantially equal rise and fall times.

SUMMARY OF THE INVENTION

The present invention is directed to a circuit testing apparatus and method which provide circuit testing drive signals with extremely accurate timing and voltage parameters and which exhibit a high level of pulse symmetry. The circuit testing apparatus of the invention includes a controller which controls signals being transferred between the circuit under test and the circuit testing apparatus. A driver circuit in the circuit testing apparatus generates signals to be applied to the circuit under test. The driver circuit includes an output stage circuit coupled to the circuit under test. The output stage circuit includes a linear amplifier which receives a control signal from the controller and generates from the control signal a drive signal to be applied to the circuit under test. In one embodiment, the linear amplifier is a class A linear amplifier.

The driver circuit is coupled to a pin on the circuit under test. In general, the pin electronics can include a separate driver circuit for each pin on the circuit under test, with a driver circuit being couple to each pin, such that separately generated and controllable drive signals can be applied to each pin.

The circuit testing apparatus can also include a receiver circuit coupled to a pin on the circuit under test to receive output or response signals from the circuit under test. In general, the pin electronics can include a separate receiver circuit for each pin on the circuit under test, with a receiver circuit being coupled to each pin, such that response signals from multiple pins can be separately received and processed by the pin electronics.

The pin electronics of the invention can include a driver circuit and a receiver circuit coupled together into a receiver/driver circuit which is coupled to a pin on the circuit under test. When a signal is being received by the pin electronics via the pin, the driver circuit portion of the receiver/driver circuit is electrically disconnected from the pin. Likewise, when a stimulus signal is being applied to the pin, the receiver portion of the receiver/driver circuit can be electrically disconnected from the pin. In general, the pin electronics include a receiver/driver circuit coupled to each pin on the circuit under test that is being used to test the circuit. Each receiver/driver circuit is individually controllable to receive signals on its respective circuit pin and/or apply a stimulus signal to its respective pin.

In one embodiment, each driver circuit includes a pair of transistors for driving the output stage circuit. In one embodiment, the pair of transistors is a differential-input pair which receives a differential voltage input signal to generate the drive signal to be applied to the circuit under test. In one particular embodiment, the transistors are bipolar junction transistors. A current source can be coupled to the transistors to drive a current through the transistors. A resistance can be coupled between the transistors such that the differential voltage input signal controls an amount of current conducted through the resistance to control a current level in each of the transistors to generate the drive signal applied to the circuit under test.

In one embodiment, the driver circuit includes a pair of current sources, one for each transistor. Each current source drives a current through its respective transistor. Again, the resistance is coupled between the transistors such that the differential voltage input signal controls an amount of current through the resistance to control a current level in each of the transistors to generate the drive signal applied to the circuit under test.

The circuit testing apparatus of the invention provides numerous advantages over prior approaches. Because the output stage of the driving circuit uses a linear amplifier, transistors in the output stage do not switch on and off. This reduces the effects of stray capacitance and stored charge in the transistors of the output stage such that drive signals with highly accurate attributes such as voltage level, timing, etc., as well as pulses with high levels of symmetry, can be obtained. This results in a test system capable of providing highly accurate and efficient testing of high-speed digital circuits such as the future generations of microprocessors.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
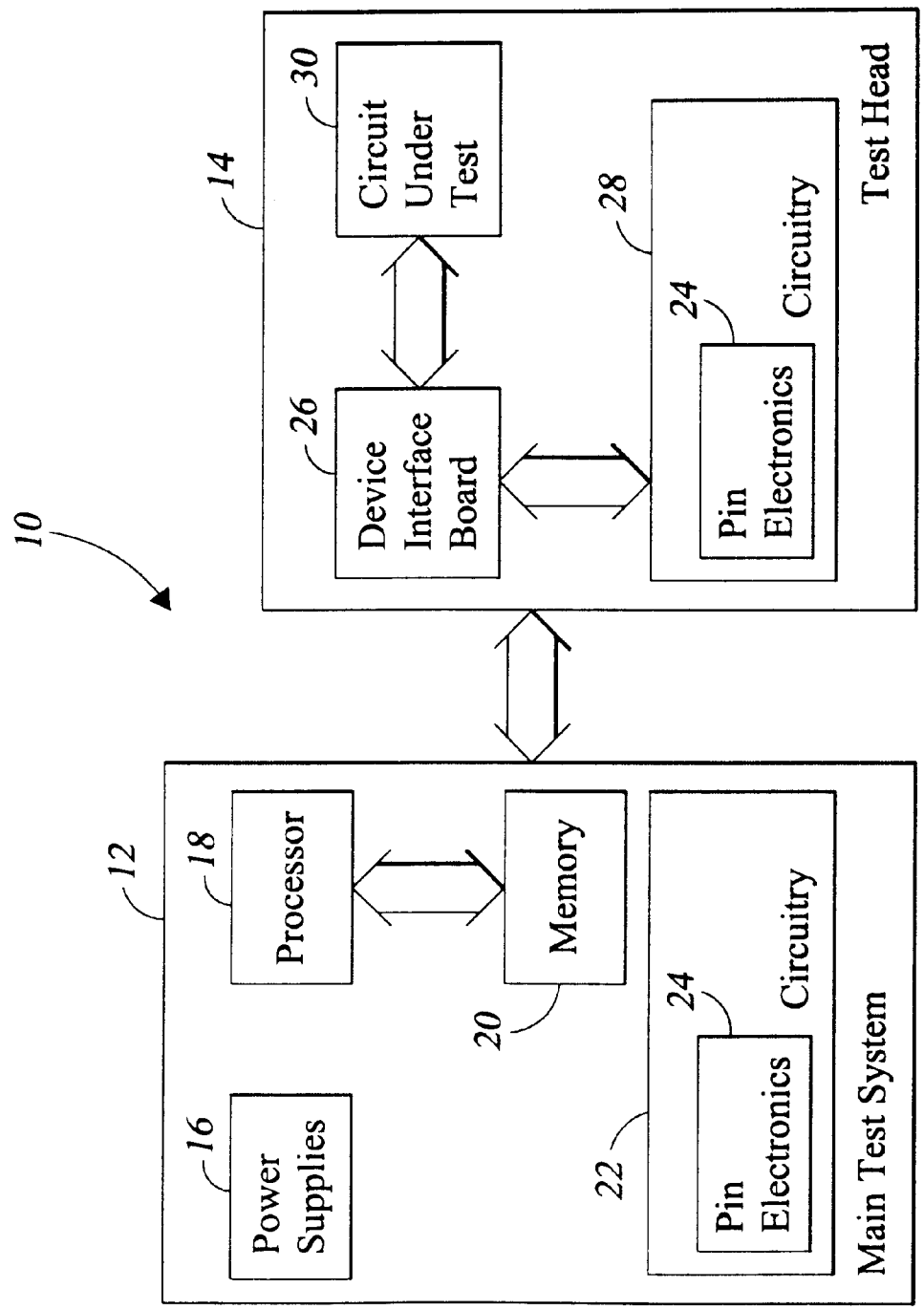
FIG. 1 contains a schematic block diagram of one embodiment of a circuit testing system in accordance with the present invention.

FIG. 1 contains a schematic block diagram of one embodiment of a circuit testing system 10 in accordance with the present invention. The system 10 includes a main test system or console 12 interfaced to a test head 14. The console 12 includes a controller or processor 18 and memory 20 which can be implemented in, for example, a personal computer. The processor 18 runs under the control of a program stored in the memory 20 for automatically testing a circuit under test 30 mounted in the test head 14. The processor 18 and memory 20 control virtually all aspects of the tests being performed including the timing and levels of DC and time varying stimulus signals applied to the circuit under test. The processor 18 and memory 20 also process and store data for response signals transferred by the circuit under test 30 to the console 12 in response to the stimulus signals. The console 12 also includes multiple power supplies 16 used for providing power to the circuit under test 30 during testing and also to provide the stimulus signals applied to the circuit under test 30 during testing. The console 12 also includes electronic circuitry 22 designed and implemented according to the particular circuit under test 30 and the particular tests being performed. The circuitry 22 can include the pin electronics 24 used to interface with the pins on the circuit under test 30 in accordance with the invention. As shown in FIG. 1, in an alternative embodiment, the pin electronics 24 are implemented in the test head 14. It will be understood that the pin electronics 24 are not implemented in both the console 12 and the test head 14 but are illustrated in both places in FIG. 1 merely to illustrate that the location of the pin electronics is not limited to only one of the possible locations.

As mentioned above, the circuit under test 30 is mounted in the test head 14 during testing. The circuit under test 30 can be any type of circuit or integrated circuit such as a microprocessor circuit. The pin electronics 24 interface with the circuit under test 30 via a device interface board 26 to apply stimulus signals to, and receive response signals from, the circuit under test 30. The device interface board 26 includes interconnections between the pin electronics 24 and the pins on the package of the circuit under test 30 as well as the electronics used to facilitate the interconnections, e.g., filtering circuitry. The device interface board 26 also includes the mechanical interface to the package pins on the circuit 30. When the circuit 30 is held in place in a socket on the device interface board 26, connections are made to the pins on the circuit 30 to complete the interface between the system 10 and the circuit 30. The pin electronics 24 are shown in FIG. 1 as part of electronic circuitry 28. Like the circuitry 22 in the console 12, the circuitry 28 refers to electronic circuitry required to perform the particular required tests on the particular circuit being tested. This can be, for example, amplification circuitry, signal conditioning circuitry, filtering circuitry, etc.

Figure 2:
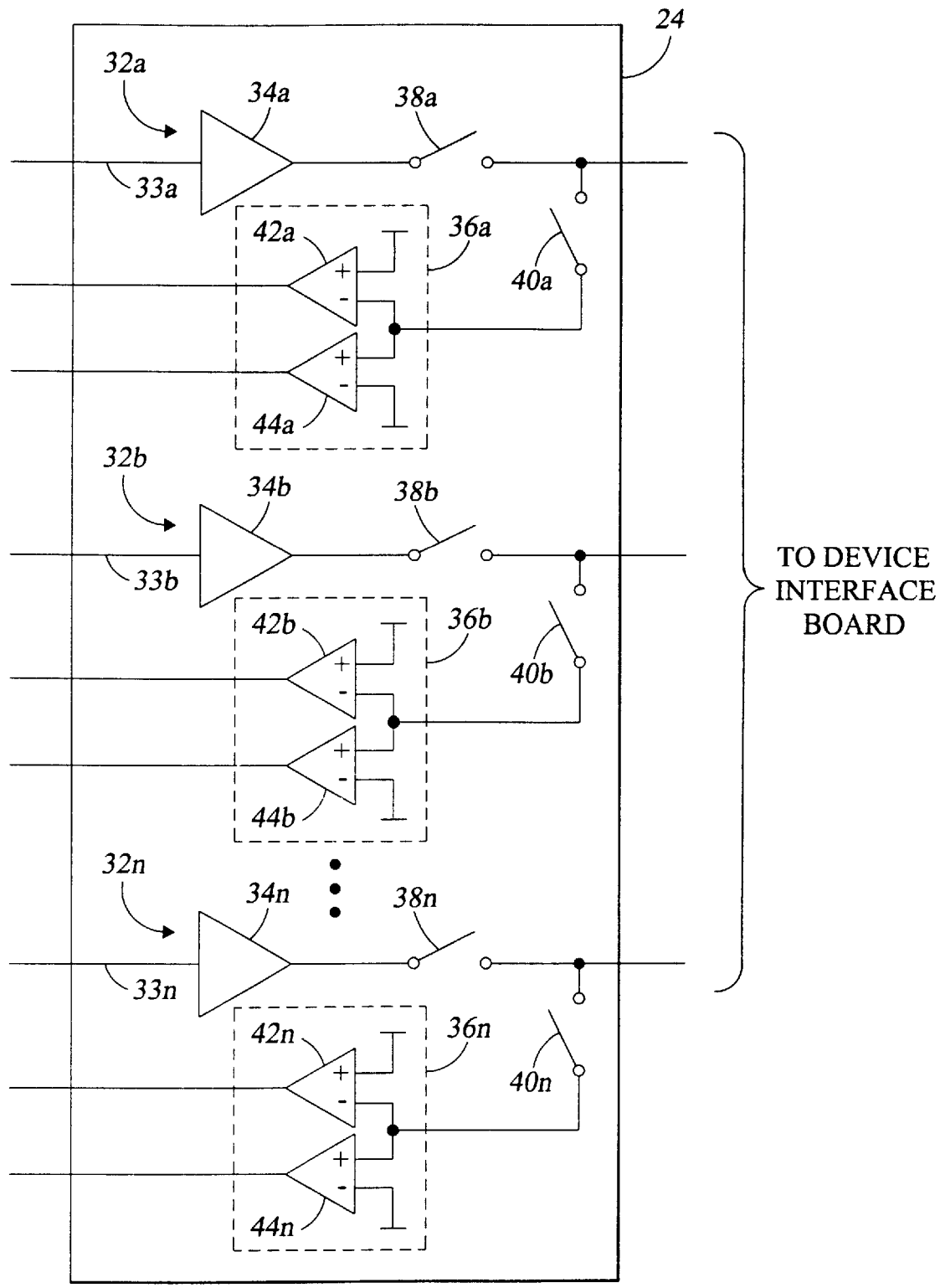
FIG. 2 contains a schematic block diagram of one embodiment of pin electronics in the circuit testing system in accordance with the present invention.

FIG. 2 is a schematic block diagram illustrating the general configuration of one embodiment of the pin electronics 24 in accordance with the invention. The pin electronics include a receiver/driver circuit 32a, 32b, . . . , 32n for each pin in the circuit under test 30 to which a connection is to be made by the test system. Each receiver/driver circuit 32 includes a pin driver circuit 34 and a receiver circuit 36 coupled together to a line which is coupled to the circuit under test via the device interface board 26. Each pin driver 34 is coupled to the line via an electronic switch 38 which allows the driver 34 to be electrically disconnected from the line when the line is being used to receive signals from the circuit under test. Each receiver circuit 36 is also coupled to the line via an electronic switch 40 which allows the receiver 36 to be electrically disconnected from the line when the line is being used to apply a drive signal to the circuit under test.

Each receiver circuit 36 can include a window comparator circuit formed from a pair of comparators 42 and 44 connected together as shown. In each window comparator circuit, an upper threshold voltage is applied to the noninverting input of the comparator 42 and a lower threshold voltage is applied to the inverting input of the comparator 44. The outputs of the comparators are coupled to the test system for analysis. The timing of state changes in the comparator outputs can be used to analyze a signal received from the associated output of the circuit under test.

The pin driver circuits 34 receive a signal on an input line 33 from the controlling processor 18 which defines the signal that is to be generated and applied to the circuit under test by the driver 34. For example, the signal received on the line 33 can be a square wave which transitions between a logic high level and a logic low level at a particular frequency, duty cycle, etc., determined to be appropriate for the particular test. In response, the pin driver 34 must generate a stimulus signal in accordance with the parameters of the controlling signal for application to the circuit under test.

Figure 3:
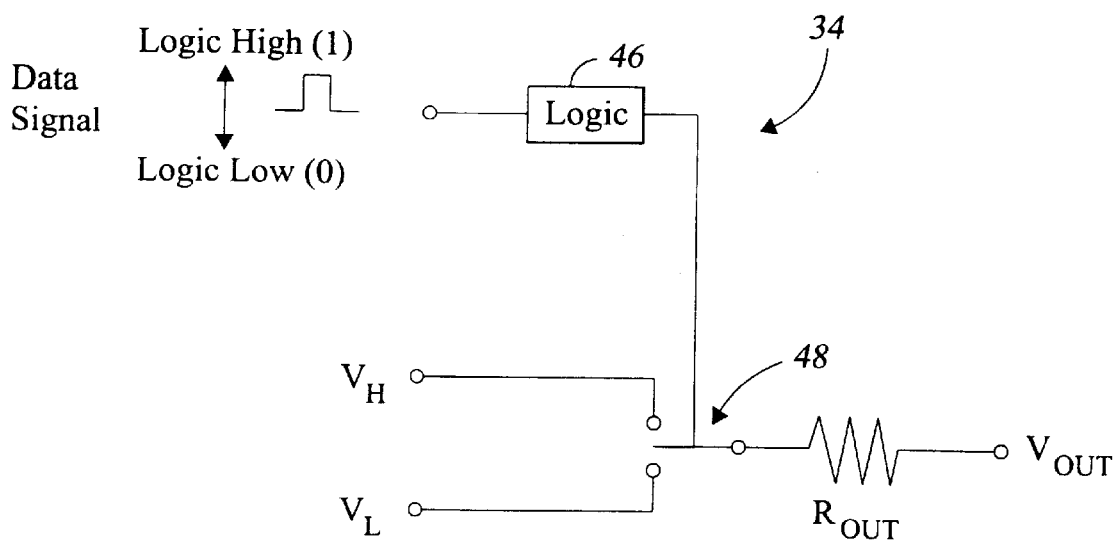
FIG. 3 is a schematic diagram illustrating the logical function of pin electronics in accordance with the invention.

FIG. 3 is a schematic block diagram which illustrates the logical function of the pin driver circuit 34. The controlling data signal which defines the parameters of the desired output drive signal is applied to input logic circuitry 46. The signal in general can transition between logic low and high levels and can be characterized by a number of signal parameters, e.g., pulse rise and fall times, pulse symmetry, pulse duration, square wave duty cycle, etc. The control signal is applied to logic 46 which is used to control switching of a switching means 48. The switching means 48 effectively generates a stimulus signal that is compatible with the circuit under test and which complies as closely as possible with the signal parameters defined by the data control signal applied to the logic 46. That is, as the control signal transitions between its logic high and low states, the switching means 48 applies signal levels compatible with the circuit under test. For example, when the control signal is in a logic high state, the switching means 48 is configured to apply a drive signal at a high voltage level referred to herein as $V_H$. Likewise, when the control signal is in a logic low state, the switching means 48 is configured to apply a drive signal at a low voltage level referred to herein as $V_L$. These voltages are applied through an output resistance $R_{OUT}$ to generate the drive signal voltage level $V_{OUT}$ to be applied as a stimulus to the circuit under test.

To generate the drive signal for application to the circuit under test with the desired voltage level and timing accuracy, as well as signal quality and fidelity, the driver circuit 34, and particularly the switching means 48, are actually implemented with amplification and signal conditioning circuitry designed to meet the drive signal requirements. However, as circuits being tested have become faster and more dense, the requirements for drive signals have become extremely challenging to meet. Driver circuits used in conventional testing systems are becoming increasingly incapable of meeting the increasingly stringent drive signal requirements.

For example, one conventional type of driver uses a class AB output stage which operates in class A conditions at low output currents and class B conditions when an output device shuts off due to higher output currents. These class AB drivers offer a high degree of functionality including high voltage swing capability and relatively low power, but they also suffer from a number of limitations when ultimate speed and accuracy are required. In particular these limitations are due to the fact that current flowing through the output transistor string is allowed to be shut off in at least one of the transistors.

Another conventional type of driver is referred to as a class A driver. Class A drivers operate at higher power levels than AB drivers, and their output swings are generally lower. Class A drivers operate faster and more accurately than AB drivers. Class A drivers provide for an output voltage swing that occurs as a current is either allowed to pass or not allowed to pass through its output resistor. That is, the driver transitions between two states, one in which current flows through the output resistor and one in which the current is shut off. Under high-speed dynamic conditions, output transistors are being switched on and off very quickly to switch the current through the output resistance between on and off. A problem arises in this situation due to the fact that the transistors turn on very differently than they turn off. Accordingly, there is a marked difference in the two switching situations, i.e., on-to-off and off-to-on, in the current flow through the output resistance. As a result, the output waveform can exhibit a large amount of asymmetry. In particular, when a transistor is switched on and off, the rising edge of the output pulse will not have the same characteristics as the falling edge. This is generally due to junction capacitance and stored charge in the transistors as they are made to switch on and off. Thus, in these types of circuits, transistors can be made to switch on and off very quickly, but not accurately enough to accommodate next-generation testing.

Figure 4:
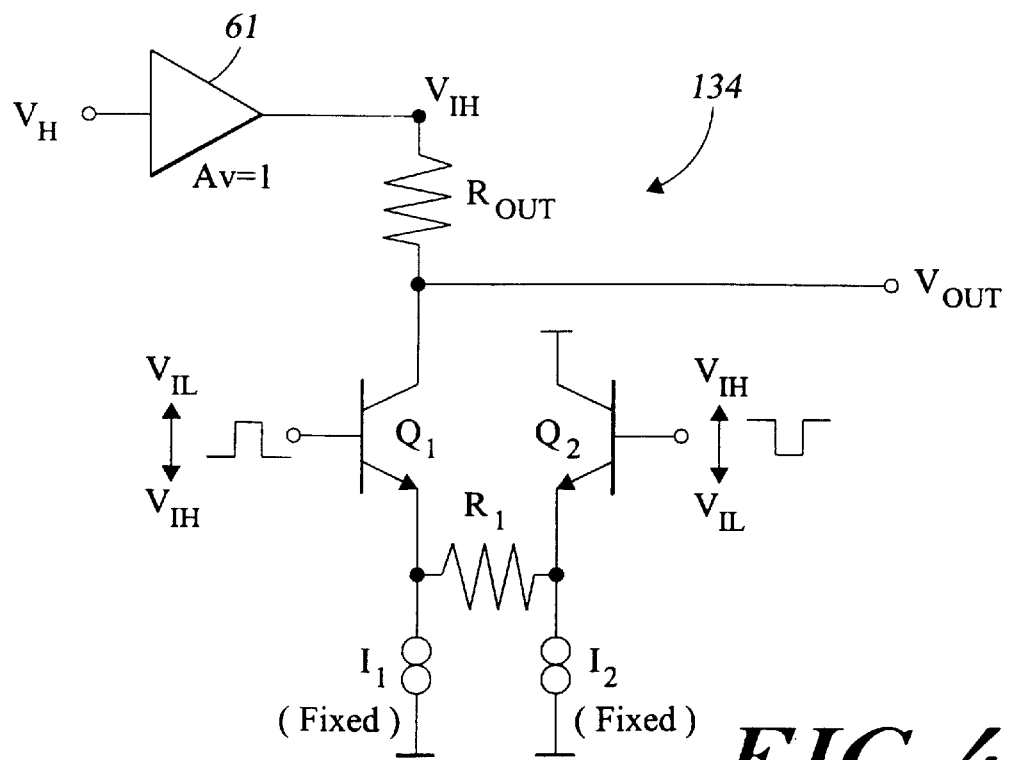
FIG. 4 is a schematic diagram of one embodiment of a portion of a pin driver circuit in accordance with the invention.

FIG. 4 contains a schematic diagram of one embodiment of a portion of a pin driver circuit 134 in accordance with the invention which addresses these problems of conventional pin driver circuits. The pin driver circuit 134 includes a differential pair of transistors Q1 and Q2 connected as shown. Each emitter leg includes a current source value $I_1$ and $I_2$, each of which is set at a fixed current. A gain degeneration resistor R1 is connected between the emitters of the transistors Q1 and Q2 such that the configuration performs as a linear amplifier instead of the switched circuits used in the prior art systems.

In the circuit 134 of FIG. 4, the current through the leg of the circuit that contains the transistor Q1, and, therefore, the current through the output resistor $R_{OUT}$, determines the output voltage level $V_{OUT}$ generated by the driver circuit output stage. The resistance values R1 and $R_{OUT}$ are selected such that the voltage drop across the output resistance $R_{OUT}$ sets the output voltage $V_{OUT}$ of the drive signal to the desired levels. The amount of current flowing through the transistor Q1 is controlled in turn by the amount of current flowing through the resistor R1. When the voltage on the emitter of Q2 is higher than that of Q1, then current flows from the Q2 side of R1 to the Q1 side of R1. With the current $I_1$ set at an appropriate level, a relatively small amount of current flows through Q1 and $R_{OUT}$, and the output voltage $V_{OUT}$ is at a high level. When the voltage on the emitter of Q2 is lower than that of Q1, then current flows through R1 from the Q1 side to the Q2 side of R1. A relatively high level of current flows through Q1 and $R_{OUT}$, and the output voltage level $V_{OUT}$ is at a low level. Thus, by controlling the amount of current through the resistor R1, the level of the output voltage $V_{OUT}$ is controlled.

The current through R1 is controlled by the voltage levels on the emitters of Q1 and Q2. These are determined by the controlling input signal provided at the base inputs of the differential-input pair Q1 and Q2. This differential-input signal, which for this description takes the form of a square pulse or some combination of square pulses, transitions between a low level input voltage $V_{IL}$ and a high level input voltage $V_{IH}$. When the Q1 base is at the high level $V_{IH}$ and the Q2 base is at the low level $V_{IL}$, current flows through R1 from the Q1 side to the Q2 side and the output voltage $V_{OUT}$ is at a low level $V_L$. Likewise, when the Q1 input is at the low level $V_{IL}$ and the Q2 base is at the high level $V_{IH}$, current flows through R1 from the Q2 side to the Q1 side and the output voltage $V_{OUT}$ is at a high level. The low and high output levels are also determined by the selection of the output resistance $R_{OUT}$. The high level output drive voltage $V_H$ is applied to $R_{OUT}$ by a unity gain amplifier 61. The value of $R_{OUT}$ is selected such that when the higher current flows through $R_{OUT}$, the output voltage $V_{OUT}$ is at the desired low output voltage value, and when the lower current flows through $R_{OUT}$, the output voltage $V_{OUT}$ is at the desired high output voltage value.

The currents $I_1$ and $I_2$ set by their respective current sources are chosen to be at levels compatible with the resistances R1 and $R_{OUT}$ and, in one embodiment, are set to an equal fixed current. That is, in one embodiment, $I_1$ and $I_2$ are fixed, and $I_1=I_2$. The currents $I_1$ and $I_2$ are chosen such that regardless of the direction of current flow through R1, both transistors Q1 and Q2 are conducting some current, i.e., neither transistor is completely shut off, and the difference in current between the two states flowing through $R_{OUT}$ determines the voltage swing of the output $V_{OUT}$. For example, if $R_{OUT}$ is 50 ohms, and the difference in current through Q1 in the low state and the high state is 20 ma, then the output voltage can swing between 0 and 1.0 volt.

The operation of the circuit of FIG. 4 will now be illustrated by example circuit parameters. It will be understood that these parameters are used only to illustrate the invention and are not limiting. Other circuit parameters can be used within the scope of the invention.

Assuming that it is desired to set the output voltage $V_{OUT}$ to swing between 0 and 1.0 volt and $R_{OUT}$ is 50 ohms, the difference in current through $R_{OUT}$ between states should be set to 20 ma. The source currents $I_1$ and $I_2$ can each be set to 12 ma and R1 can be chosen to be 50 ohms. The voltage $V_H$ at the top of $R_{OUT}$ is set to 1.1 volts. The differential-input signal can be controlled such that $V_{IL}$ is 0 and $V_{IH}$ is 0.5 volt. In this configuration, the current through $R_{OUT}$ in the high output state is 2 ma, resulting in a 0.1 volt drop across $R_{OUT}$ such that $V_{OUT}$ is 1.0 volt. The current through $R_{OUT}$ in the low output state is 22 ma, resulting in a 1.1 volt drop across $R_{OUT}$ such that $V_{OUT}$ is 0.0 volt.

To illustrate this, when the Q1 base is at 0.5 volt and the Q2 base is at 0.0 volt, the emitters of Q1 and Q2 are at approximately −0.2 and −0.7 volt, respectively. Current at a level of 10 ma flows in R1 from the Q1 side to the Q2 side, resulting in a total current in Q1 and $R_{OUT}$ of 12+10=22 ma. The current through Q2 is at 12−10=2 ma. The 22 ma current through $R_{OUT}$ results in a 1.1 drop across $R_{OUT}$, or a $V_{OUT}$ of 0.0 volt. When the Q1 base is at 0.0 volt and the Q2 base is at 0.5 volt, the emitters of Q1 and Q2 are at approximately −0.7 and −0.2 volt, respectively. Current at a level of 10 ma flows in R1 from the Q2 side to the Q1 side, resulting in a total current in Q1 and $R_{OUT}$ of 12−10=2 ma. The current through Q2 is at 12+10=22 ma. The 2 ma current through $R_{OUT}$ results in a 0.1 volt drop across $R_{OUT}$, or a $V_{OUT}$ of 1.0 volt.

Hence, unlike the switched circuits in prior systems, the linear circuit of the invention uses fixed current sources and controls the output swing by varying the base differential voltage of Q1 and Q2. The source currents and resistance R1 are chosen such that the operation of the device never results in either transistor being shut off. Keeping both devices on all the time eliminates the stored charge problem found in prior devices. Also, controlling the output level by varying the base voltages allows the circuit of the invention to operate at acceptable output voltage levels with relatively small input voltage levels. These factors provide the capability of generating very fast and accurate stimulus signals with very high fidelity and signal quality.

Figure 5:
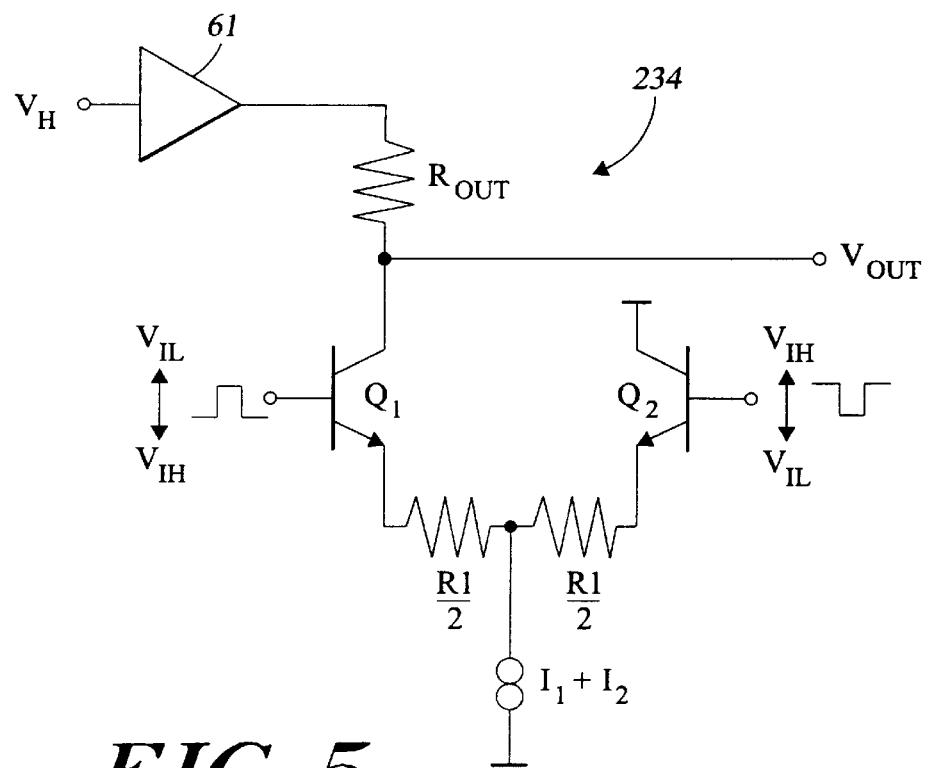
FIG. 5 is a schematic diagram of an alternative embodiment of a portion of a pin driver circuit in accordance with the invention.

FIG. 5 is a schematic diagram of an alternative embodiment of a portion of a pin driver circuit 234 in accordance with the invention. In this embodiment, the resistance R1 of the previous embodiment is implemented as two resistors connected as shown, each having a value of R½. Also, the dual current sources $I_1$ and $I_2$ of the previous embodiment are implemented as a single current source having a current value of $I_1+I_2$. This circuit functions in a similar fashion to the circuit shown in FIG. 4.

Figure 6:
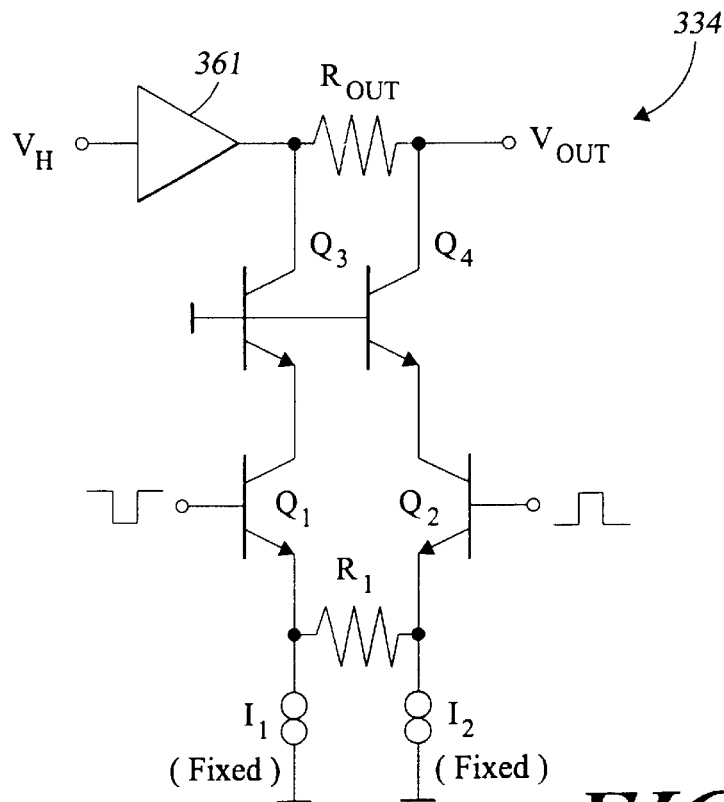
FIG. 6 is a schematic diagram of another alternative embodiment of a portion of a pin driver circuit in accordance with the invention.

FIG. 6 is a schematic diagram of another alternative embodiment of a portion of a pin driver circuit 334 in accordance with the invention. In this embodiment, the circuit includes cascode transistors Q3 and Q4 as well as a connection point for the unused current that flows through Q2 and Q4. This causes the total current sourced by the $V_H$ voltage source 361 to be constant regardless of output voltage $V_{OUT}$ amplitude. From a DC point of view, this keeps the output resistance of the $V_H$ buffer amplifier 361 constant which in turn reduces interaction between the high and low output voltage levels caused by changes in output swing level. From a dynamic point of view, the buffer 361 sees very small transient current spikes rather than large current transitions. The cascode transistors Q3 and Q4 also improve output stage bandwidth by keeping the collectors of Q1 and Q2 at constant voltages. The $V_H$ voltage source used in one embodiment can be a class AB style driver.

It is noted that the foregoing describes the circuit of the invention as including a differential input in which the difference between the input voltages is used to operate the circuit. However, it will be understood that a single-ended input can also be used in accordance with the invention. That is, one of the inputs can be held at a constant voltage while the other is varied to control the input to the circuit.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A circuit testing apparatus comprising:
   a controller for controlling signals being transferred between a circuit under test and the circuit testing apparatus; and
   a driver circuit for generating signals to be applied to the circuit under test, the driver circuit including a pair of transistors which receive a single-ended voltage input to drive an output stage circuit coupled to the circuit under test, the output stage circuit including a linear amplifier circuit, the linear amplifier circuit receiving a control signal from the controller and generating therefrom a drive signal to be applied to the circuit under test.

2. The circuit testing apparatus of claim 1, wherein the linear amplifier is a class A amplifier.

3. The circuit testing apparatus of claim 1, wherein the driver circuit is coupled to a pin on the circuit under test.

4. The circuit testing apparatus of claim 1, further comprising a receiver circuit for receiving output signals from the circuit under test.

5. The circuit testing apparatus of claim 4, wherein the receiver circuit is coupled to a pin on the circuit under test.

6. The circuit testing apparatus of claim 4, wherein the receiver circuit and the driver circuit are coupled together to a pin on the circuit under test.

7. The circuit testing apparatus of claim 4, further comprising a plurality of receiver circuits coupled to a respective plurality of driver circuits to form a plurality of receiver/driver circuits, each receiver/driver circuit being coupled to a pin on the circuit under test.

8. The circuit testing apparatus of claim 1, wherein the driver circuit comprises a differential-input pair of transistors which receive a differential voltage input signal to drive the output stage circuit.

9. The circuit testing apparatus of claim 1, further comprising a current source driving a current through each of the transistors.

10. The circuit testing apparatus of claim 9, further comprising a resistance coupled between the transistors, the differential voltage input signal controlling an amount of current through the resistance to control a current level in each of the transistors to generate the drive signal applied to the circuit under test.

11. The circuit testing apparatus of claim 1, further comprising a pair of current sources coupled to the transistors, each of the current sources driving a respective current through a respective one of the pair of transistors.

12. The circuit testing apparatus of claim 11, further comprising a resistance coupled between the transistors, the differential voltage input signal controlling an amount of current through the resistance to control a current level in each of the transistors to generate the drive signal applied to the circuit under test.

13. The circuit testing apparatus of claim 1, wherein the transistors are bipolar junction transistors.

14. A circuit testing apparatus comprising:
controlling means for controlling signals being transferred between a circuit under test and the circuit testing apparatus; and
driving means for generating signals to be applied to the circuit under test, said driving means including a pair of transistors which receive a single-ended voltage input to drive an output stage circuit coupled to the circuit under test, the output stage circuit including a linear amplifier circuit, the linear amplifier circuit receiving a control signal from the controlling means and generating therefrom a drive signal to be applied to the circuit under test.

15. The circuit testing apparatus of claim 14, wherein the linear amplifier is a class A amplifier.

16. The circuit testing apparatus of claim 14, wherein the driving means is coupled to a pin on the circuit under test.

17. The circuit testing apparatus of claim 14, further comprising a receiving means for receiving output signals from the circuit under test.

18. The circuit testing apparatus of claim 17, wherein the receiving means is coupled to a pin on the circuit under test.

19. The circuit testing apparatus of claim 17, wherein the receiving means and the driving means are coupled together to a pin on the circuit under test.

20. The circuit testing apparatus of claim 17, wherein:
the receiving means comprises a plurality of receiver circuits; and
the driving means comprises a plurality of driver circuits respectively coupled to the plurality of receiver circuits to form a plurality of receiver/driver circuits, each receiver/driver circuit being coupled to a pin on the circuit under test.

21. The circuit testing apparatus of claim 14, wherein the driving means comprises a differential-input pair of transistors which receive a differential voltage input signal to drive the output stage circuit.

22. The circuit testing apparatus of claim 21, further comprising a current source driving a current through each of the transistors.

23. The circuit testing apparatus of claim 21, further comprising a pair of current sources coupled to the transistors, each of the current sources driving a respective current through a respective one of the pair of transistors.

24. The circuit testing apparatus of claim 21, wherein the transistors are bipolar junction transistors.

25. The circuit testing apparatus of claim 14, further comprising a resistance coupled between the transistors, the differential input voltage signal controlling an amount of current through the resistance to control a current level in each of the transistors to generate the drive signal applied to the circuit under test.

26. A method of testing a circuit under test comprising:
providing a controller for controlling signals being transferred to and from the circuit under test;
providing a driver circuit with a pair of transistors which receive a single-ended voltage input to drive an output stage circuit coupled to the circuit under test;
providing a linear amplifier circuit in the output stage circuit; and
with the linear amplifier circuit, receiving a control signal from the controller and generating from the control signal a drive signal to be applied to the circuit under test.

27. The method of claim 26, wherein the linear amplifier is a class A amplifier.

28. The method of claim 26, wherein the driver circuit is coupled to a pin on the circuit under test.

29. The method of claim 28, wherein the receiver circuit is coupled to a pin on the circuit under test.

30. The method of claim 26, wherein the receiver circuit and the driver circuit are coupled together to a pin on the circuit under test.

31. The method of claim 26, further comprising a plurality of receiver circuits coupled to a respective plurality of driver circuits to form a plurality of receiver/driver pairs, each receiver/driver pair being coupled to a pin on the circuit under test.

32. The method of claim 26, wherein the driver circuit comprises a differential-input pair of transistors which receive a differential voltage input signal to drive the output stage circuit.

33. The method of claim 32, further comprising a current source driving a current through each of the transistors.

34. The method of claim 33, further comprising a resistance coupled between the transistors, the differential input voltage signal controlling an amount of current through the resistance to control a current level in each of the transistors to generate the drive signal applied to the circuit under test.

35. The method of claim 32, further comprising a pair of current sources coupled to the transistors, each of the current sources driving a respective current through a respective one of the pair of transistors.

36. The method of claim 35, further comprising a resistance coupled between the transistors, the differential input voltage signal controlling an amount of current through the resistance to control a current level in each of the transistors to generate the drive signal applied to the circuit under test.

37. The method of claim 32, wherein the transistors are bipolar junction transistors.

* * * * *